Sept. 6, 1955 R. N. HALL 2,717,343

P-N JUNCTION TRANSISTOR

Original Filed Nov. 18, 1952

Inventor:
Robert N. Hall,
by Paul A. Frank
His Attorney.

United States Patent Office 2,717,343
Patented Sept. 6, 1955

2,717,343

P-N JUNCTION TRANSISTOR

Robert N. Hall, Schenectady, N. Y., assignor to General Electric Company, a corporation of New York Original application November 18, 1952, Serial No. 321,262. Divided and this application June 25, 1954, Serial No. 439,319

5 Claims. (Cl. 317—235)

My invention relates to semiconductor devices and more particularly to transistors of the P-N junction type. This application is a division of my co-pending application, Serial No. 321,262, filed November 18, 1952 and assigned to the assignee of the present invention.

Semiconductors, such as germanium and silicon, have become conventionally classified as either positive (P-type) or negative (N-type), depending primarily upon the type and sign of their predominant conduction carriers. With P-type semiconductors the direction of rectification as well as the polarity of generated thermoelectric, photoelectric, and Hall effect voltages are all opposite to that produced with N-type semiconductors. According to prevailing theory, conduction of N-type material is primarily electronic, in other words, by the movement of free electrons; while conduction in P-type material is primarily by means of the movement of what have become known as "positive holes" which arise from electron vacancies in the electronic system of atoms of the semiconductor.

It has been found that the determinant of whether a particular semiconductor body exhibits N-type or P-type characteristics lies primarily in the type of impurity elements present in the semiconductor. Some impurity elements, called "donors," usually having a higher valence than the semiconductor, function to furnish additional free electrons to the semiconductor so as to produce an electronic excess N-type semiconductor. Other impurity elements called "acceptors," usually having a lower valence than the semiconductor, function to absorb electrons from the semiconductor to create P-type semiconductors with an excess of "positive holes." These donor and acceptor impurities may generically be referred to as "activators." Antimony, phosphorus and arsenic, falling in group V of the periodic table are examples of "donor" activators for germanium and silicon; while aluminum, gallium and indium falling in group III of the periodic table are examples of "acceptor" activators for germanium and silicon. Only minute traces of these activators, less than 1 part per million, are ordinarily sufficient to produce marked electrical characteristics of one type or the other.

P-N junction semiconductor units are units in which a P-type semiconductor adjoins a zone of N-type semiconductor to form an internal space charge barrier called the "P-N junction." This P-N junction possesses marked rectifying, thermoelectric and photoelectric properties. An electric current may be passed easily in only one direction through this P-N junction, and a generation or modulation of electrical current may be produced between the P-type and N-type zones on opposite sides of this junction by concentrating light or heat upon the junction.

Recently it has been found that a semiconductor body having a region of one conductivity type adjoining two regions of opposite conductivity type to form two P-N junctions can be used to make a three terminal device known as a "transistor" to provide current, voltage, and power amplification. These amplifying semiconductor bodies have become known as P-N-P or N-P-N junction units in accord with the distribution of their P-type and N-type regions. The three terminal semiconductor devices utilizing such multiple junction units have known as "large area" or "P-N junction type" transistors in order to distinguish them from transistors in which two small area rectifying regions provided by point contact electrodes serve the purpose of such P-N junction regions.

In order to increase the amplification and high frequency response of such P-N junction type transistors, it has been found desirable to make the central semiconductor zone between the two P-N junctions quite thin, ordinarily less than 0.01 inch. Multiple P-N junction units with thin central zones and methods for making such units form a portion of the subject matter of my patent application Serial No. 304,203, filed August 13, 1952 and assigned to the same assignee as the present invention.

One problem in making such thin central zone P-N junction transistors has been that of connecting an electrode to this thin central zone without short-circuiting the P-N junctions on either side of this zone. Sharpened point or line contacting electrodes have heretofore been required to make small area contact to the thin exposed edge of this central zone. Such small area contacts are inherently fragile, carry limited current, and are prone to transverse movement unless securely bonded or welded to the central zone.

Accordingly, one object of the invention is to provide a wide area contacting electrode connection to a thin central zone of a P-N junction transistor unit which connection does not short circuit the P-N junctions on either side of the central zone.

Another object of the invention is to provide an electrode connection to the central zone of a multiple junction semiconductor unit, which electrode connection also functions to increase the efficacy of the injected or "emitted" current-controlling conduction carriers and thus to increase the amplification factor of the transistor.

A further object is to provide improved high power transistors having broad area contacting electrode connections to the thin central zones of their multiple P-N junction semiconductor units.

In accord with the invention, the electrode which makes contact to the central semiconductor zone of a multiple P-N junction unit consists of an activator element capable of inducing excess conduction carriers having the same polarity as the predominant conduction carriers already present in this central zone of the unit. If, for example the central zone comprises P-type semiconductor, the contacting activator electrode consists of an acceptor impurity element. If, on the other hand, the central zone comprises N-type semiconductor, the contacting activator electrode consists of a donor impurity element. The activator electrode is allowed to overlap the P-N junctions into the opposite conductivity type zones on one or both sides of the central zone so as to make a sturdy high-current-carrying broad area base electrode connection with the semiconductor unit. This activator electrode is fused to and within the surface region of the semiconductor unit with which it is in contact. Because of its unusual activating effect, this activator electrode introduces into this fused surface region excess conduction carriers of the same conductivity type as the central zone and thus eliminates the possibility of undesired opposite type conduction carrier injection from the base electrode into the central zone. Simultaneously this fused activator region makes respective rectifying P-N junction connections with the opposite conductivity endwise zones with which it is in contact; and these fused activator P-N junctions merge with the internal P–N junctions of the semiconductor unit.

In one high power transistor embodying the invention, a number of multiple P–N junction units are integrally formed along the length of the same semiconductor body and a single activator electrode, preferably in the form of a solder layer, makes simultaneous excess conduction-carrier-furnishing connections with all of the edges of the central zones while forming rectifying P–N junction connections with the remaining opposite conductivity zones of the unit.

The novel features which are believed characteristic of the invention are set forth in the appended claims. The invention itself, together with further objects and advantages therein, may best be understood by reference to the following description taken in connection with the accompanying drawing in which:

Figure 1:
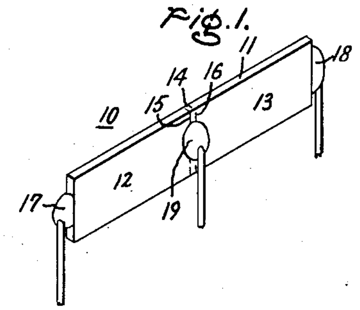
Fig. 1 is a perspective view of a simple P–N junction type transistor embodying the invention.

Referring to Fig. 1, one embodiment of the invention is shown as comprising a transistor 10 having a multiple P–N type junction semiconductor unit 11 in the form of a flat germanium wafer or bar made up of two N-type semiconductor zones 12 and 13 and a central, preferably thin, P-type zone or layer 14 separating zones 12 and 13. Unit 11 may conveniently be 0.1" long, 0.03" wide, and 0.02" thick. Zone 14 is contiguous and integral with zones 12 and 13 and forms P–N junctions 15 and 16 therewith. For convenience in discussion, zones 12 and 13 are described as N-type while central zone 14 is described as P-type, although it is to be understood that the conductivity type of each of these zones may be reversed to produce a P–N–P junction unit rather than the N–P–N junction unit described. Emitter and collector electrodes 17 and 18 are respectively secured in electrically conducting contact with endwise zones 12 and 13 and preferably make good conductive fused connections therewith. Electrodes 17 and 18 may constitute any good electrically conductive metal but preferably include a donor activator element such as antimony in order to introduce excess negative conduction carriers into their connection regions with N-type zones 12 and 13. If a P–N–P junction unit is employed, emitter and collector electrodes 17 and 18 preferably comprise an acceptor activator element to introduce excess positive conduction carriers into the P-type zones with which they are fused.

For high gain and high frequency response, central zone 14 comprises a fairly thin layer, less than 0.01" as measured along the length of unit 11. Only the edge 14' of this thin layer 14 is exposed for an electrode connection thereto.

In accord with the invention a "base" or "return" electrode 19 is connected in a mechanically sturdy manner to central zone 14 without short-circuiting P–N junctions 15 and 16 by fusing both to central zone 14 and to at least one outer zone 12, 13 a drop or small pellet of an activator element 19 capable of furnishing conduction carriers of the same conductivity type present in central zone 14. As shown in detail in Fig. 2, activator base electrode 19 may be permitted to overlap both P–N junctions 15 and 16. If an N–P–N junction unit, as in Fig. 1, is employed, the activator electrode 19 must consist of an acceptor activator element, such as indium, or a mixture of acceptor activator elements. On the other hand, if a P–N–P junction unit is employed, the activator base electrode must consist of a donor activator element such as antimony or a mixture of donor activator elements. Activator electrode 19 should consist of substantially pure materials, and be particularly free of all electrically conducting elements which have no, or opposite-conductivity-type, activating effect with the semiconductor involved.

Figure 2:
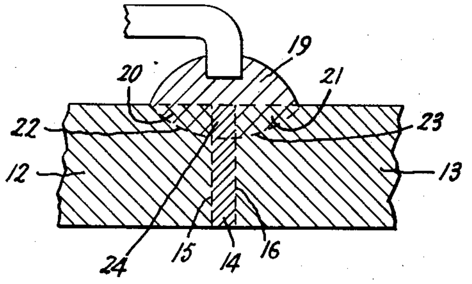
Fig. 2 is an enlarged view of the electrode connection to the central semiconductor zone of the P–N junction unit employed in the transistor of Fig. 1.

The fusion of acceptor base electrode 19 to semiconductor zones 12, 13 and 14, has two important effects best described in connection with Fig. 2. First of all, the resulting impregnation and diffusion of the acceptor activator electrode 19 into the respective surface-adjacent regions 20 and 21 of N-type zones 12 and 13 converts these surface regions into P-type semiconductor material. As a consequence, P–N junctions 22 and 23 are formed at the boundary or limit of the depth of penetration of the impregnating acceptor activator element 19 within regions 20 and 21 of N-type zones 12 and 13. P–N junctions 22 and 23 merge and become integral with the original P–N junctions 15 and 16. Activator base electrode 19 may thus be considered to make connection to a widened P-type surface-adjacent region and to form rectifying P–N junction connections with N-type semiconductor zones 12 and 13 respectively. The second effect of this activator base electrode connection is to impregnate the surface adjacent region 24 of P-type central zone 14 as well as regions 20 and 21 with excess positive conduction carriers. An excellent reservoir of positive conduction carriers is thus connected to this central zone. Moreover, and what is quite important for efficient transistor operation, this reservoir of excess positive conduction carriers prevents the injection of negative conduction carriers from the base electrode 19 into the P-type zone 14. Such base-injected negative conduction carriers reduce the collector current controlling effect of the negative carriers injected from N-type zone 12 when a current in the easy-flow direction is passed between emitter electrode 17 and base electrode 19. It will be appreciated that conventional metal electrodes comprising, for example, copper, platinum, gold or silver, do not prevent such base-electrode negative conduction-carrier-injection into P-type zone 14.

If a P–N–P junction semiconductor unit is employed in place of N–P–N junction unit 11, then the activator base electrode 19 consists of a donor impurity. The fusion of this donor impurity to a P–N–P junction unit produces, in the same manner as described above, a rectifying P–N junction connection with outer P-type zones and an excellent electron furnishing connection with the central N-type zone.

The desired fused connection between activator electrode 19 and the surface region 20, 21, 24 of N–P–N junction wafer 11 may be formed by merely heating a drop or pellet of the activator electrode 19 in contact with unit 11, preferably in a non-oxidizing atmosphere under suitable conditions of temperature and time, until the activator electrode 19 securely fuses to and with the surface-adjacent region of unit 11. The temperature employed ranges from 300 to 700 degrees centigrade for germanium and somewhat higher for silicon, depending upon the particular donor or acceptor impurity selected for activator element 19. The heating time may be anywhere from slightly less than 1 second to several minutes. The time and temperature employed are not critical and need only be sufficient to cause a "wetting" and discernible penetration of activator electrode 19 with and into unit 11. If a germanium N–P–N junction unit 11 is used with an indium base electrode 19, temperatures in the neighborhood of 400 degrees centigrade for a few minutes have been found sufficient to accomplish the requisite fusion; while if a germanium P–N–P junction unit 11 is used with an antimony base electrode 19, temperatures in the negihborhood of 650 degrees centigrade for a similar period of time have been found suitable. Aluminum base electrodes 19 have been applied to silicon and germanium N–P–N junction units 11 using temperatures in the neighborhood of 600°.

Transistors, such as described in connection with Figs 1 and 2, consistently show current gain factors over 50 when operated in a conventional "grounded-emitter" transistor amplifying circuit.

Figure 3:
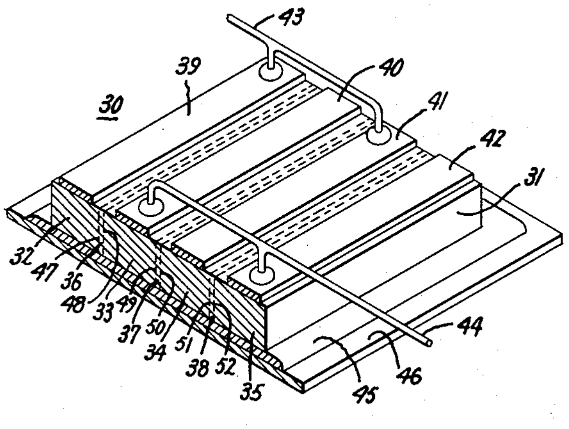
Fig. 3 is a perspective view, partly in section, of a high power transistor embodying the invention.

Referring now to Fig. 3, there is shown a high power transistor 30 embodying the invention. Transistor 30 comprises a multiple P–N junction germanium slab or wafer 31 having a number of N-type zones 32, 33, 34, 35 extending along one major dimension and each separated by intermediate P-type zones or layers 36, 37, 38. Semiconductor slab 31 may conveniently be 1.0" long, 0.5" wide, and 0.04" thick. Film-like electrodes 39, 40, 41 and 42, preferably consisting of or including a donor activator such as antimony, are secured in good electrically conductive large area contact with one major face of each respective N-type region 32, 33, 34, and 35. Each metal film electrode 39, 40, 41, and 42 takes the form of a narrow strip, and care must be taken that each strip does not overlap and thus short-circuit the P–N junctions 47—52 formed upon either side of the intermediate P-type layers 36, 37, and 38. Alternate electrodes 39, 41 and 40, 42 are interconnected by such means as conductors 43 and 44, and constitute emitter and collector electrodes respectively for transistor 30. Electrodes 39, 40, 41 and 42 may also comprise electrically conducting metals that are not donor activators, but should not comprise an acceptor activator when connected to N-type zones, as shown.

The "base" or "return" electrode connection to the intermediate P-type zones 36, 37, and 38 is accomplished by means of a layer or plate 45 consisting of an acceptor activator element, such as indium, which is connected to conductive plate treminal 46 and which is fused to and within the major surface region of semiconductor slab 31 opposing the surface with which emitter and collector electrodes 39, 40, 41 and 42 are connected. The fusion of indium base electrode 45 with germanium slab 31 functions in the same manner as discussed in connection with Figs. 1 and 2 to produce a rectifying P–N junction connection with each N-type region 32, 33, 34, and 35 and a good "positive-hole" conduction carrier furnishing connection with each P-type region 36, 37 and 38. Although for convenience in discussion transistor 30 has been described as comprising substantial N-type zones separated by thin P-type semiconductor layers, it will be appreciated that the conductivity types may be reversed, and a donor activator such as antimony substituted for the indium acceptor activator 45 described above.

The construction of high-power transistor 30 of Fig. 3 has a number of advantages over the simpler construction of transistor 10 of Fig. 1. In addition to greater current handling capacity, the emitter and collector electrodes of transistor 30 extend closer to the respective P–N junctions and thus enable better control of the currents traversing the junctions. Moreover, it is not necessary to determine the exact location of the P–N junctions in germanium wafer 31 since the activator electrode 45 contacts the entire bottom surface of wafer 31, and proper low impedance contact to the intermediate P-type layers 36, 37, and 38 is thus assured.

It will be appreciated that although only 4 N-type regions and 3 P-type regions are shown in connection with the transistor 30, many more consecutive N- and P-type regions may be employed, if desired, for greater current carrying capacity.

P–N junction units such as unit 31 having along its length a plurality of N-type regions each separated by a P-type region, and methods of making such units, form a portion of the subject matter covered in my above-mentioned patent application, Ser. No. 304,203. The method of making such multiple junction semiconductor units as described in this latter patent application is to prepare a melt consisting of a semiconductor such as germanium, a trace of a donor impurity such as antimony, and a trace of an acceptor impurity such as gallium; the impurity traces being present in proper amounts to provide "intrinsic" or electrically balanced type semiconductor in a crystal grown from the melt at a predetermined constant growth rate. The donor and acceptor impurities selected each have a different rate of segregation constant variation over a range of crystal growth rate variation encompassing this predetermined constant intrinsic growth rate. A germanium crystal is then grown by seed crystal withdrawal from the melt and the temperature of the melt is cyclically raised and lowered while the crystal is growing to vary the growth rate above and below this predetermined constant intrinsic growth rate, and thereby to produce along the length of the grown crystal alternate regions of opposite conductivity type. A desired multiple P–N junction unit is then extracted from this grown crystal.

It will be appreciated that the transistor 30 of Fig. 3 has P–N junction areas several hundred times greater than that of the small bar-type transistor 10 of Fig. 1 and also has a much better thermal dissipation characteristic. As a consequence, transistor 30 can handle considerably more power than transistor 10. Transistor 30 can carry several amperes of emitter and collector current without exceeding the limits of their linear operation. Since collector supply voltages of 50 to 100 volts may be employed, a power rating of about 100 watts is permissible.

Moreover, both of the transistors 10 and 30 have base electrode connection impedances that are much smaller than heretofore generally obtainable. A transistor made in accord with transistor 10 of Fig. 1 has an equivalent distributed impedance between activator electrode 19 and P-type layer 14 less than 20 ohms, as compared with typical values of 400 ohms with conventional sharpened pressure or welded contacts.

Although my invention has been described above in connection with specific embodiments, many modifications may be made. It is to be understood that I intend by the appended claims to cover all such modifications as fall within the true spirit and scope of the invention.

What I claim as new and desire to secure by Letters Patent of the United States is:

1. A power transistor comprising a semiconductor body having opposing major surfaces and having along a major dimension thereof a plurality of one conductivity-type zones and a plurality of opposite conductivity-type zones, each said opposite conductivity-type zone being intermediate and integrally joined to two of said one conductivity-type zones to form respective P–N junctions therewith, a plurality of electrodes each making good conductive contact with a respective one of said one conductivity-type zones along the same major surface of said body, and a further electrode consisting of an activator element for furnishing to said body conduction carriers of said opposite conductivity type and fused to and with the entire other major surface of said body.

2. A power transistor comprising a germanium body having opposing major surfaces and having along a major dimension thereof a plurality of N-type zones and a plurality of P-type zones, each P-type zone being intermediate and contiguous with two N-type zones, a plurality of electrodes each making good conductive contact with a respective N-type zone, conductors interconnecting the electrodes contacting alternate N-type zones, and a further electrode consisting of an acceptor activator element making positive conduction-carrier-furnishing contact with all of the P-type zones of said slab.

3. A power transistor comprising a germanium body having opposing major surfaces and having along a major dimension thereof a plurality of P-type zones and a plurality of N-type zones, each N-type zone being intermediate and contiguous with two P-type zones, a plurality of electrodes each making good conductive contact with a respective P-type zone, conductors interconnecting the electrodes contacting alternate P-type zones, and a further electrode consisting of a donor activator element making negative conduction-carrier-furnishing contact with all of the N-type zones of said slab.

4. A power transistor comprising a flat rectangular germanium slab having opposing major surfaces and having major dimensions much greater than its thickness dimension, said slab having along one major dimension a plurality of rectangular N-type zones and a plurality of thin P-type zones, each P-type zone being intermediate and contiguous with two N-type jones to form respective P–N junctions therewith, a plurality of alternately interconnected electrodes each making large area contact with a respective N-type zone along the same major surface of said slab, and a further electrode consisting of indium fused to and with the entire other major surface of said slab.

5. A power transistor comprising a flat rectangular germanium slab having opposing major surfaces and having major dimensions much greater than its thickness dimension, said slab having along one major dimension a plurality of rectangular P-type zones and a plurality of thin N-type zones, each N-type zone being intermediate and contiguous with two P-type zones to form respective P–N junctions therewith, a plurality of alternately interconnected electrodes each making large area contact with a respective P-type zone along the same major surface of said slab, and a further electrode consisting of antimony fused to and with the entire other major surface of said slab.

No references cited.